United States Patent [19]

Visser

[11] Patent Number: 5,322,710

[45] Date of Patent: Jun. 21, 1994

[54] METHOD OF PROVIDING A SUBSTRATE WITH A SURFACE LAYER FROM A VAPOR

[75] Inventor: Jan Visser, Eindhoven, Netherlands

[73] Assignee: U.S. Philips Corporation, New York, N.Y.

[21] Appl. No.: 771,375

[22] Filed: Oct. 2, 1991

[30] Foreign Application Priority Data

Oct. 5, 1990 [NL] Netherlands ............... 9002164

[51] Int. Cl.$^5$ ............... C23C 14/00; C23C 16/00
[52] U.S. Cl. ............... 427/248.1; 118/715; 118/726
[58] Field of Search ............... 118/715, 726; 427/248.1, 255.1, 255.2, 255.3

[56] References Cited

U.S. PATENT DOCUMENTS

| | | | |
|---|---|---|---|
| 4,436,674 | 3/1984 | McMenamin | 118/726 |
| 4,783,343 | 11/1988 | Sato | 118/726 |
| 4,842,827 | 6/1989 | Graf et al. | 422/112 |
| 4,849,259 | 7/1989 | Biro et al. | 427/248.1 |
| 4,911,101 | 3/1990 | Ballingall, III et al. | 118/726 |

OTHER PUBLICATIONS

1989 Leybold Heraus Vacuum Products and Technology-catalog Leybold Heraus Vacuum Products, Inc. p. 5.

*Primary Examiner*—Shrive Beck
*Assistant Examiner*—Bret Chen
*Attorney, Agent, or Firm*—Paul R. Miller

[57] ABSTRACT

A method is described of providing a substrate (2) with a surface layer from a gas phase with a vapor in a reactor chamber (1), which vapor is generated through evaporation of a substance (5) in a reservoir (4) and is conducted to the reactor chamber (1) through a gas line (8) (Chemical Vapor Deposition (CVD)). According to the invention, the vapor is conducted from the reservoir (4) to the reactor chamber (1) in that it is pumped from the reservoir (4) to the reactor chamber (1) by a pump (9) included in the gas line. The use of the pump renders the method very flexible. Thus the vapor flow can be easily adapted through adaptation of a pumping rate associated with the pump. In addition, the vapor flow is not dependent on a process pressure which prevails in the reactor (1).

14 Claims, 1 Drawing Sheet

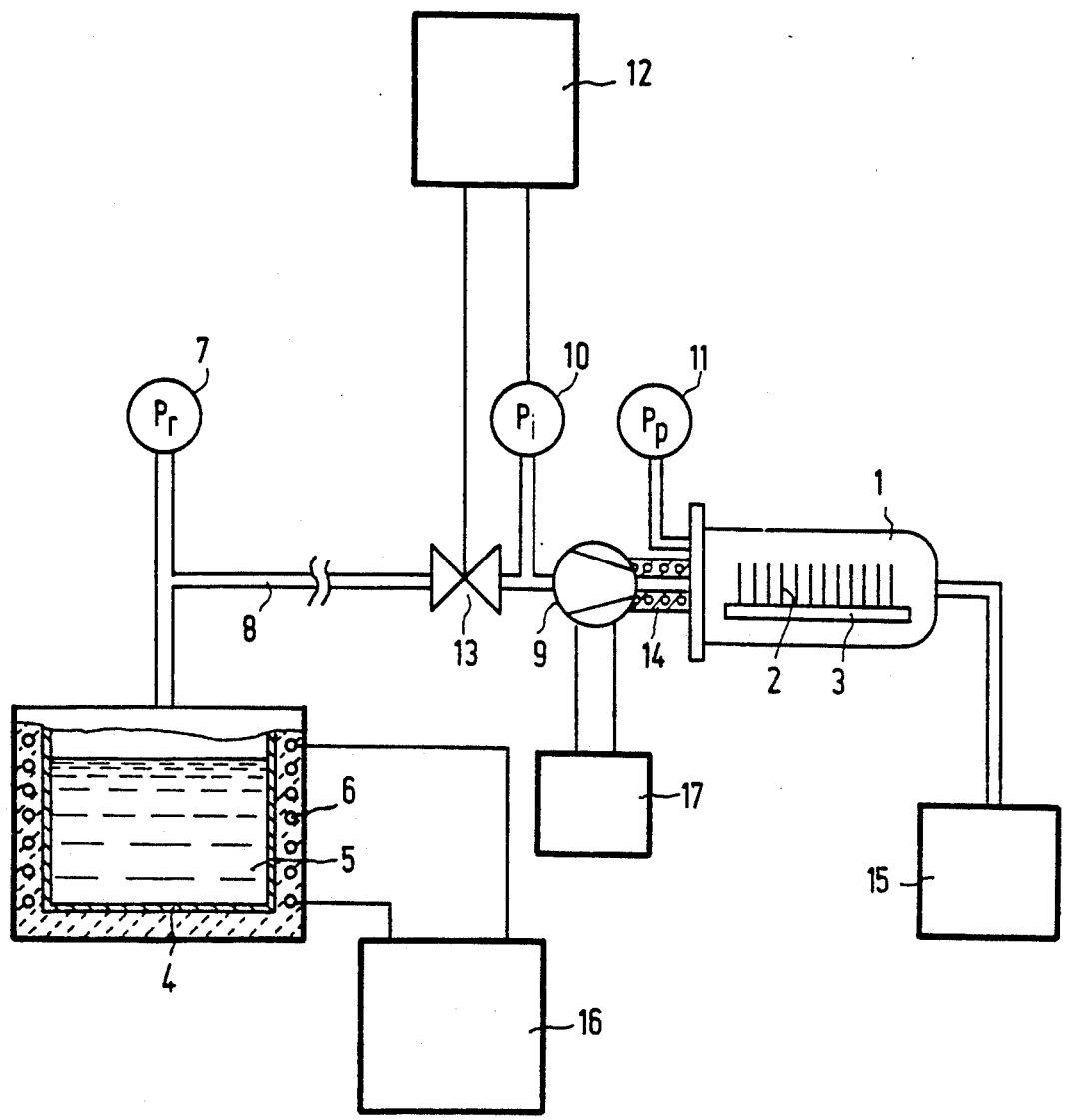

METHOD OF PROVIDING A SUBSTRATE WITH A SURFACE LAYER FROM A VAPOR

The invention relates to a method of providing a substrate with a surface layer from a gas phase by means of a vapour in a reactor chamber, which vapour is generated by evaporation of a substance in a reservoir and conducted to the reactor chamber through a gas line. The invention also relates to a device for implementing such a method.

Such a method is used, for example, for providing metal, semiconductor, or ceramic substrates with amorphous, polycrystalline, epitaxial, or doped semiconductor layers; with dielectric layers; and with metal and metallic conductor layers, for which liquids, such as tetraethoxysilane (TEOS) or trichlorosilane, as well as solid substances, such as boron-containing glasses, may be used as a vapour source. More particularly, the method can be used in the manufacture of semiconductor devices for providing silicon oxide layers on semiconductor substrates through deposition from a TEOS vapour. Alternatively, the method may be used for doping a semiconductor substrate, the surface layer then being formed by a top layer of the substrate. The substrate is then heated to such a temperature that the vapour diffuses into the substrate.

BACKGROUND OF THE INVENTION

A method of the kind mentioned in the opening paragraph is known from the European Patent Application no. EP-A 0 220 552, according to which TEOS vapour is conducted from the reservoir to the reactor chamber and the substance is heated to such a level that a vapour is generated in the reservoir having a comparatively high pressure and this vapour is then conducted through a resistance in the gas line to the reactor chamber which is kept at a constant pressure. If the vapour in front of this resistance has a pressure $p_i$ and the pressure in the process chamber is $p_p$, the following holds for a laminar flow through the resistance R:

$$R = \text{constant}/(p_i + p_p)$$

A vapour flow $Q_d$ then moves to the reactor chamber for which it holds that:

$$Q_d = (p_i - p_p)(p_i + p_p)/\text{constant} = (p_i^2 - p_p^2)/\text{constant}$$

The vapour flow $Q_d$ is kept at a desired, defined value in that the pressures $p_i$ and $p_p$ are maintained at desired, defined values.

In practice, the known method turns out to be not very flexible. If one wants to provide layers more quickly, for example, processes are taken with process pressures $p_p$ which are five to ten times higher than in the known method. If the same vapour flow $Q_d$ is to be maintained, the pressure $p_i$ must then be raised. Since the value of the resistance R can only be varied to a limited degree because of the type of flow in the gas line and the inertia of the vapour. It will also be necessary to increase $p_i$ further if the desire is to increase the vapour flow $Q_d$ which is conducted into the reactor chamber. In the known method, $p_i$ depends inter alia on the temperature of the reservoir. Thus, in the known method, $p_i$ is 307 Pa, while a pressure of 1067 Pa occurs in the reservoir at a temperature of approximately 45° C. If much higher pressures $p_i$ are to be realised, the temperature of the reservoir must be raised. A drawback is, however, that this is practically impossible since the TEOS in the reservoir will be dissociated when the reservoir temperature exceeds approximately 80° C.

SUMMARY OF THE INVENTION

The invention has for its object inter alia to realise a flexible method by which $p_i$ can be low and consequently the reservoir temperature can also be low, so that no dissociation of the vapour takes place.

According to the invention, the method is for this purpose characterized in that the vapour is conducted from the reservoir to the reactor chamber by being pumped from the reservoir to the reactor chamber by a pump included in the gas line. If the pump operates with a pumping rate $S_p$, it displaces a vapour flow $Q_d$, given a pressure $p_i$ at the inlet side, for which the following relationship is true:

$$Q_d = p_i \times S_p$$

The vapour flow $Q_d$ is independent of the process pressure $p_p$ prevalent at the outlet side of the pump. As a result, it is possible to raise the process pressure $P_p$ as required, while nevertheless the vapour flow $Q_d$ remains constant. $p_i$ is taken to be so low that a low temperature in the reservoir will suffice and no dissociation of the vapour will take place. If one wants to increase the vapour flow $Q_d$, this is possible by adapting the pumping rate $S_p$. The pumping rate may, for example, be set for a defined value in that the pump is run at a certain rpm. A flexible process is thus obtained by means of the method according to the invention, in which changes in the desired values of the process pressure $p_p$ and the vapour flow $Q_d$ can be easily effected.

The vapour flow $Q_d$ can be kept at a defined value in that the product of the inlet pressure $p_i$ and the pumping rate $S_p$ is kept at a defined value. This is possible by controlling the pumping rate $S_p$ in such a way, the inlet pressure $p_i$ being variable, that the product $p_i \times S_p$ remains at a defined value, or conversely by controlling $p_i$ while $S_p$ is variable, or by keeping both $p_i$ and $S_p$ constant. It is often impossible to control the pumping rate $S_p$, which depends on the speed of the pump, with sufficient quickness, since the pump has a certain inertia owing to its mass. The same inertia, however, means that the pump can be comparatively easily kept at a constant pumping rate. Preferably, therefore, the method according to the invention is characterized in that the vapour is conducted to the reactor chamber in a defined flow by being kept at a defined pressure in the gas line immediately before the pump and in that the pump is operated with a constant pumping speed.

Preferably, the method is characterized in that the vapour in the gas line in a location immediately before the pump is kept at a defined pressure $p_i$ and the pressure $p_i$ is compared with a desired value $p_g$, and subsequently, if $p_i$ is greater than $p_g$, a valve is closed upstream of the location in the gas line, i.e. it is closed further, and, if $p_i$ is smaller than $p_g$, the valve is opened (further), a pressure higher than the defined pressure $p_i$ being maintained in the reservoir. In this way the inlet pressure of the pump can be kept at a desired defined value, while also a simple and quick process switch-over is possible by opening and closing of the valve.

Vapour of a certain pressure is present in the gas line. In practice, the gas line is kept at such a high pressure that the vapour does not condense, so that pressure variations resulting from condensation do not occur. The gas line between reservoir and reactor chamber may have a considerable length in practice since the reservoir is not immediately next to the reactor chamber owing to its size and to the fact that it should be possible to provide it with new substance from time to time. In the method according to the invention, it is possible to choose the pressure $p_i$ at the inlet side of the pump to be lower than the process pressure $p_p$. It is possible then to keep the pressure, and thus also the temperature, in the gas line between reservoir and pump low. Preferably, the pump is positioned so close to the reactor chamber that the gas line to be heated is relatively short, since then the portion of the gas line which can be kept at a relatively low temperature is at its maximum. Moreover, the vapour flow $Q_d$ through the pump is then controlled to the required defined value immediately in front of the reactor chamber, so that inertia effects of vapour in the gas line between pump and reactor chamber play a much lesser part, and the vapour flow conducted into the reactor chamber is more accurately determined.

Preferably, according to the invention, the pump used is a "molecular drag" type pump, also called "Holweck" pump. A "molecular drag" type pump is compact, so that it can be positioned close to the reactor chamber. In addition, this type of pump is very suitable for pressures from approximately 100 Pa to 10,000 Pa at the pump outlet. Such pressures are widely used in deposition processes from the vapour phase (Chemical Vapour Deposition, CVD).

The invention further relates to a device for providing a substrate with a surface layer, comprising a reactor chamber for accommodating the substrate, a reservoir for accommodating a substance, means for generating vapour from the substance, and a gas line for conducting the vapour from the reservoir to the reactor chamber. According to the invention, this device is characterized in that a pump is present in the gas line between the reservoir and the reactor chamber for pumping the vapour from the reservoir to the reactor chamber. With such a device, vapour generated through evaporation of the substance in the reservoir can be conducted in a defined vapour flow through the gas line to the reactor chamber as described above. The vapour flow is independent of a process pressure prevailing in the reactor chamber.

Preferably, the device according to the invention is provided with means for keeping the vapour in the gas line immediately in front of the pump at a defined pressure and with equipment for having the pump operate with a constant pumping rate. The inertia of the mass of the pump entails that the pump can be kept at a constant pumping rate relatively easily.

A further advantage is obtained when the means for keeping the vapour at the defined pressure comprise a control unit which is connected to a pressure sensor present in the gas line immediately in front of the pump, which control unit closes a valve in the gas line in front of the pressure sensor when the pressure sensor measures a pressure higher than a desired value, and opens the valve when the pressure sensor measures a pressure lower than the desired value. The pressure at the inlet side of the pump can be kept constant in a simple way with such means. It is also possible with the device to switch over to a different process simply by opening and closing of the valve.

A further advantage is obtained when the pump is positioned so close to the reactor chamber that the gas line to be heated is comparatively short.

A further advantage is obtained when the pump is a "molecular drag" type pump. A "molecular drag" type pump is compact, so that it can be positioned close to the reactor chamber. Moreover, this type of pump is very suitable for pressures from approximately 100 Pa up to 10,000 Pa at the pump outlet. Such a pump renders the device suitable for many deposition processes from the vapour phase (CVD processes).

BRIEF DESCRIPTION OF THE DRAWING FIGURE

The invention will be explained in more detail below, by way of example, with reference to a drawing. In the drawing:

The FIGURE shows the device for implementing the method according to the invention.

The FIGURE is purely diagrammatical and not drawn to scale.

DESCRIPTION OF THE INVENTION

The Drawing Figure diagrammatically shows a device for providing a substrate with a surface layer from a gas phase by means of a vapour generated through evaporation of a substances. The device shown is designed for providing a layer of silicon oxide on a semiconductor slice from the vapour of tetraethoxysilane (TEOS). The device comprises a reactor chamber 1 for accommodating the substrate 2. The reactor chamber 1 is, for example, a conventional low-pressure chemical vapour deposition reactor chamber. In the example, a number of semiconductor slices 2 are arranged in the reactor chamber 1 on a support 3, but a reactor chamber containing only one semiconductor slice is also possible. Furthermore, the device comprises a reservoir 4 made of, for example, quartz for containing a substance 5, in this case TEOS. The reservoir is provided with means for generating the vapour, in the present example a heater element 6 provided with a temperature control unit 16. A vapour having a vapour pressure $p_r$ is generated in the reservoir 4 through heating of the substance 5. This pressure is measured by a manometer 7, for example a conventional capacitance manometer. The temperature control unit 16 keeps the reservoir at approximately 35° C., the pressure $p_r$ is then approximately 532 Pa. The vapour generated in the reservoir 4 is conducted to the reactor chamber 1 through a gas line 8. The gas line 8 is made of, for example, stainless steel having a diameter of 10 mm and a length of approximately 5 m. According to the invention, the vapour is pumped from the reservoir 4 to the reactor chamber 1 by a pump 9 included in the gas line 8. If this pump operates with a pumping rate $S_p$, and a pressure $p_i$, measured by manometer 10, prevails at its inlet side, this pump displaces a vapour flow $Q_d$ for which the following is true:

$$Q_d = p_i \times S_p$$

The vapour flow is independent of the process pressure $p_p$ prevailing at the outlet side of the pump and measured by manometer 11. Manometers 10 and 11 are conventional capacitance manometers. The use of the pump 9 renders it possible to work with a comparatively low pressure $p_i$. This is because the pumping rates $S_p$ can be chosen so as to obtain a desired vapour flow $Q_d$. The advantage of a comparatively low $p_i$ is that the temperature in the gas line between reservoir 4 and pump 9 can be kept low without problems which are caused by condensation of the vapour at room temperature.

Furthermore, as will become apparent, the use of the pump 9 renders a quick and flexible control of the vapour flow $Q_d$ possible. To ensure that a layer of silicon oxide having a well-defined thickness and composition is formed on the semiconductor slice 2, the vapour is conducted to the reactor chamber in a defined vapour flow. This can be achieved in that the product $p_i \times S_p$ is kept at a defined value. Preferably, the vapour is conducted to the reactor chamber in a defined flow and is kept at a defined pressure $p_i$ just before the pump and the pump is operated with a defined pumping rate $S_p$. The inertia of the mass of the pump has the effect that the pump can be maintained at such a constant pumping rate $S_p$ relatively easily. The vapour flow $Q_d$ can thus be controlled in a quick and flexible manner.

For this purpose, the device according to the invention is provided with means 10, 12 and 13 for keeping the vapour in the gas line 8 immediately before the pump 9 at a defined pressure, and with apparatus 17 for having the pump 9 operate at a constant pumping rate. The means for keeping the vapour at the defined pressure $p_i$ preferably comprise a control unit 12 which is connected to the pressure sensor 10 present in the gas line 8 immediately before the pump 9, and which closes a valve 13 in the gas line in front of the pressure sensor 10 when the pressure sensor 10 measures a pressure higher than a desired value, and which opens the valve 13 when the pressure sensor 10 measures a pressure lower than the desired value $p_i$, where $p_r$, read by manometer 7 and higher than the defined pressure $p_i$, is maintained in the reservoir 4. The reservoir 4 then acts as an excess source of vapour of the substance 5. In this way the inlet pressure $p_i$ of the pump 9 is kept at a defined value. A quick switching on/off of the vapour flow $Q_d$ is also possible by opening and closing of the valve 13. The control unit 12 keeps the inlet pressure $p_i$ of the pump 9 at approximately 266 Pa by means of the control valve 13.

The pump 9 preferably is a "molecular drag" pump. Such a pump is compact and very suitable for outlet pressures between approximately 100 Pa and 10,000 Pa, which are widely used in deposition processes from the vapour phase. The pumping rate $S_p$ is proportional to the speed of the pump. The pump is provided with a speed control unit 17, which stabilizes the speed at approximately 30,000 rpm, corresponding to a pumping rate $S_p$ of approximately $10^{-2}$ m$^3$/s, so that a vapour flow $Q_d$ of approximately 2.66 Pa.m$^3$/s is conducted into the reactor chamber 1.

In practice, the gas line 8 between reservoir 4 and control valve 13 may have a considerable length, in the present example approximately 5 m, since the reservoir 4 on account of its size and on account of the fact that it should be possible to provide it with new substance from time to time is not situated immediately next to the pump. In the method according to the invention, it is possible to choose the pressure at the inlet side of the pump to be lower than the process pressure in the reactor chamber 1. It is possible then to keep the pressure, and consequently also the temperature in the gas line 8 between reservoir 4 and pump 9, low. According to the invention, the pump 9 is placed so close to the reactor chamber 1 that the gas line to be heated is comparatively short. This also means that the vapour flow to the reactor chamber 1 is determined immediately before the reactor chamber, so that inertia effects of vapour in the gas line 8 between pump 9 and reactor chamber 1 play a much lesser part, and the vapour flow is more accurately defined. This portion of the gas line 8 between pump 9 and reactor chamber 1 can be heated, for example, with resistance heater 14, which is a heater wire wound around the line, for example to a temperature of 60° C.

At an output of the reactor chamber 1 there is a vacuum pump 15, for example a Roots pump, in order to maintain the pressure $p_p$ of 1333 Pa required for the process. A temperature of 650° C. prevails in the reactor chamber 1.

In this embodiment, one micrometer of silicon oxide per minute is the deposited on the semiconductor substrates 2.

The invention is not limited to the embodiment given above, but many variations are possible within the scope of the invention. The invention is suitable for, for example, the application of amorphous, polycrystalline, epitaxial or doped semiconductor layers; of dielectric and of metal or metallic layers on substrates made of metal, semiconductor material, or ceramic material. Both liquids and solid substances may be used as vapour sources. A typical example of a liquid is the use of compounds having silicon components such as trichlorosilane and silicon tetrachloride, which are liquid at normal temperatures, as sources for providing silicon layers. A typical example of a solid substance is the use of various boron-containing substance such as boron glasses or ceramics as sources of boron for doping semiconductor slices or layers.

A layer having special characteristics can be applied when the substance 5 in the reservoir consists of a mixture of substances. For example, mixtures of tetraethoxysilane (TEOS), triethylphosphide (TEP), triethylarsenide (TEA) or trimethylborate (TMB) may be used, whereby silicon oxide layers may be provided with phosphorus, arsenic, or boron, respectively. Such layers may serve, for example, as sources for the diffusion of semiconductor dopants.

It is also possible to add to the vapour from the reservoir 4 a gas consisting of a vapour or a mixture of vapours, which influence the characteristics of the layer on the surface. The composition of the added gases may then be varied, as required during the provision of layers. For example, vapours of substances mentioned above such as triethyl phosphide (TEP), triethyl arsenide (TEA) or trimethyl borate (TMB) may be added.

The quantity of vapour can be influenced in a simple manner through the addition of an inert forming gas, i.e. a forming gas which does not influence the reaction in the reactor chamber. Helium or a mixture of rare gases comprising helium may be used as a forming gas.

I claim:

1. A method of forming a surface layer on a substrate comprising the steps of
   (a) generating a vapor by evaporation of a substance in a reservoir,
   (b) pumping said vapor through a gas line from said reservoir to a reactor chamber by using a pump disposed in said gas line adjacent to said reactor chamber, and
   (c) controlling vapor flow $Q_d$ of said vapor independently of a process pressure $P_p$ in said reactor chamber, where said vapor flow $Q_d$ is equal to an inlet pressure $p_i$ to said pump times a pumping rate $S_p$ of said pump.

2. A method according to claim 1, wherein said pump is operated at a constant pumping rate $S_p$, and wherein said vapor is conducted to said reactor chamber at a flow being maintained at said inlet pressure, $p_i$, immediately before said pump.

3. A method according to claim 2, wherein said step of controlling vapor flow is carried out by comparing said inlet pressure, $p_i$, with a given pressure value, $p_g$, and closing a control valve upstream of said pump in said gas line if $p_i > p_g$ or opening said control valve if $p_i < p_g$, and wherein a pressure $p_r$ in said reservoir is provided higher than $p_i$.

4. A method according to claim 3, wherein said gas line is provided with a length to separate said reservoir and said control valve.

5. A method according to claim 1, wherein said pump is disposed so close to said reactor chamber that heating of said gas line is substantially avoided.

6. A method according to claim 13, wherein a "molecular drag" pump is used as said pump.

7. A method according to claim 4, wherein said length is about 5 m.

8. A method of forming a surface layer on a substrate in a reaction chamber comprising the steps of (a) generating a vapor by evaporation of a substance in a reservoir, (b) pumping said vapor through a gas line from said reservoir to the reactor chamber by using a pump disposed in said gas line, where a pressure in said gas line is lower than in said reactor chamber, and (c) using said vapor in said reactor chamber to form the surface layer on the substrate.

9. A method according to claim 8, wherein said pump is provided adjacent to said reactor chamber.

10. A method according to claim 8, where said pump provides a higher pressure of said vapor in said reactor chamber than in said reservoir.

11. A method according to claim 8, wherein said step of controlling vapor flow is carried out by comparing said pressure, $p_i$, in said gas line with a given pressure value, $p_g$, and closing a control valve upstream of said pump if $p_i > p_g$ or opening said control valve if $p_i < p_g$, and wherein a pressure $p_r$ in said reservoir is provided higher than $p_i$.

12. A method according to claim 11, wherein said gas line is provided with a length to separate said reservoir and said control valve.

13. A method according to claim 12, wherein said length is about 5 m.

14. A method according to claim 8, wherein a "molecular drag" pump is used as said pump.

* * * * *